United States Patent [19]
Collins et al.

[11] Patent Number: 5,615,086
[45] Date of Patent: Mar. 25, 1997

[54] APPARATUS FOR COOLING A PLURALITY OF ELECTRICAL COMPONENTS MOUNTED ON A PRINTED CIRCUIT BOARD

[75] Inventors: Tom W. Collins, Saratoga; William J. Avery, San Jose; John S. Suy, San Jose; David M. Tichane, San Jose, all of Calif.

[73] Assignee: Tandem Computers Incorporated, Cupertino, Calif.

[21] Appl. No.: 245,296

[22] Filed: May 17, 1994

[51] Int. Cl.⁶ ......................................................... H05K 7/20
[52] U.S. Cl. .......................... 361/704; 257/713; 361/719; 361/773
[58] Field of Search ........................ 257/675, 707, 257/712, 713, 723, 724; 439/70–73, 76, 485; 165/74, 80.3, 185, 104.33; 361/807, 809, 810, 760, 764, 767, 772, 773, 688–690, 702, 704, 705, 718, 719

[56] References Cited

U.S. PATENT DOCUMENTS

| | | | |
|---|---|---|---|
| 3,874,768 | 4/1975 | Cutchaw | 339/17 |
| 4,254,447 | 3/1981 | Griffis | 361/386 |
| 4,468,074 | 8/1984 | Gordon | 339/75 |
| 4,854,377 | 8/1989 | Komoto | 165/80.4 |
| 4,933,808 | 6/1990 | Horton et al. | 361/336 |
| 4,936,784 | 6/1990 | Saito | 439/72 |
| 4,974,119 | 11/1990 | Martin | 361/386 |
| 5,006,962 | 4/1991 | Haley | 361/417 |
| 5,088,930 | 2/1992 | Murphy | 439/70 |
| 5,267,867 | 12/1993 | Agahdel | 439/73 |
| 5,276,961 | 1/1994 | Matta et al. | 29/827 |
| 5,311,060 | 5/1994 | Rostoker | 257/796 |

*Primary Examiner*—Gerald P. Tolin
*Attorney, Agent, or Firm*—Townsend and Townsend and Crew LLP

[57] ABSTRACT

Apparatus for cooling a plurality of electrical components mounted to a circuit board includes a base plate mounted in proximate relation to component sites on the circuit board at which electrical components are mounted. The base plate includes alignment elements that engage a alignment plate. The electrical components are carried by the alignment plate so that when the alignment plate is installed on the base plate, engaging the alignment elements, the electrical components are registered to and installed at corresponding component sites in a manner that aligns electrical leads of the components to printed circuit pads at the component sites. The base plate and alignment plate are sealed, and a coolant circulated therethrough.

5 Claims, 3 Drawing Sheets

APPARATUS FOR COOLING A PLURALITY OF ELECTRICAL COMPONENTS MOUNTED ON A PRINTED CIRCUIT BOARD

REFERENCE TO RELATED APPLICATIONS

This application is related to the following commonly-assigned applications filed concurrently herewith:

| TITLE | SERIAL NO. |
| --- | --- |
| APPARATUS FOR MOUNTING SURFACE MOUNT DEVICES TO A CIRCUIT BOARD | 08/245,497 |
| METHOD FOR SURFACE MOUNTING SURFACE MOUNT DEVICES TO A CIRCUIT BOARD | 08/245,260 |
| APPARATUS FOR COOLING MULTIPLE PRINTED CIRCUIT BOARD MOUNTED ELECTRICAL COMPONENTS | 08/245,258 |
| HEAT CONDUCTIVE APPARATUS FOR ENCAPSULATED ELECTRICAL COMPONENTS | 08/245,490 |

BACKGROUND OF THE INVENTION

The present invention is directed generally to attaching electrical components to printed circuit boards. The invention relates more particularly to removably affixing surface mount integrated circuit packages with splayed leads to printed circuit boards, wire boards, or wire assemblies.

An integrated circuit combines numerous active and passive electrical circuitry elements on a single device called a die or chip. Commonly, the electronics industry, including the computer, communications, and consumer electronics sub-industries, interconnect integrated circuits by attaching them to printed circuit boards. Because chips are inherently small and fragile devices, they are usually imbedded in a substrate called a chip carrier or package before they are attached to the printed circuit board. Protruding from the package are a number of electrical conducting leads. The manner in which the leads protrude vary; they may extend through the bottom of the package (e.g. pin or pad grid arrays), they may be arrayed along two edges of the package (e.g. dual in-line pins), or they may fan out from the edges of the package (e.g. gull wing and J pins).

The wiring on printed circuit boards comprises thin metallic strips embedded in an insulating material. These strips interconnect leads protruding from one integrated circuit package to leads protruding from other circuit packages mounted on the same board. To make all the required connections, the boards typically have several layers of interconnect wiring. The wiring determines the placement of the integrated circuit packages on the board and routes electrical signals among the integrated circuits. Leads may connect to the wiring in a variety of ways. One method involves drilling holes in the board and through the wiring at appropriate locations, inserting leads through the holes, and making mechanical and electrical attachments among the leads, the wiring, and the holes. Another, increasing popular technique, is called surface mount technology. This method involves arranging contact pads on the surface of the printed circuit board. The pads provide paths for electrical signals from leads to the appropriate embedded wires. Leads are placed on top of the pads and mechanically and electrically attached.

There are a number of methods of mechanically and electrically attaching integrated circuit package leads to printed circuit boards. The most commonly used techniques in the electronics industry require lead based solder. There are many environmental and economic disadvantages in using solder:

Lead is a well known hazardous material linked to numerous serious human ailments. While there is no evidence that lead in electrical solder has an impact on worker health or the environment, both the Environmental Protection Agency and members of Congress have expressed concern. Industry research in this area is ongoing.

Depositing lead onto printed circuit boards often requires fluxes which must be cleansed. The preferred method of cleansing involves freon which is known to persist for long periods in the atmosphere and is known to deplete ozone. Other methods of cleansing boards involve using water which creates problems of treating waste water to eliminate pollutants.

The heat required to deposit solder on boards may damage the components being attached or the board itself.

Repairing a board or component requires reheating which may cause further damage and require scrapping an expensive assembly.

Equipment to mass produce soldered boards (e.g. wave solder and flux cleansing machines) is expensive and cumbersome.

Metal solders frequently short (or bridge) leads to one another, adversely alter the electrical characteristics of integrated circuits (e.g. increasing capacitance between leads), limit how closely leads may be spaced (thus limiting the density of integrated circuits on a board), and result in defective connections (e.g. cold solder joints) which may be difficult or impossible to detect before a board is placed in service.

Soldered bonds between boards and components may be broken when the board is dropped, flexed, or otherwise vibrated.

Many soldered assemblies require gold connections instead of less expensive metals with superior or nearly equivalent electrical properties (i.e. silver, copper, and aluminum), because of gold's thermal expansion and anti-corrosive properties.

Surface mount technologies generally involve applying a 3- to 4-mil coating of solder paste onto contact pads on the surface of the board, placing package leads onto the pads, and melting (reflowing) the solder. This is sufficient mechanically to hold the package in place while making the proper electrical connection. Surface mounting has a number of advantages over older techniques; it saves board space by permitting dies to be mounted in small packages with closely spaced leads, it reduces the number of levels of embedded wires in a board, and it allows components to be mounted on both sides of a board. However, surface mount technology not only entails the known problem of using solder, but also raises the additional problem of properly aligning the leads onto the contact pads. Proper placement of surface mount components generally requires specialized computer controlled equipment.

Because of the advantages of surface mount technology, much research has been directed at the soldering and alignment problems. Two alternatives to soldering are the subject of most research; attaching packages to boards with adhesive (e.g. TAB technology) or applying sufficient pressure to packages to make a mechanical and electrical connection. Proper placement of components for TAB and pressure mount techniques has proved to be as difficult a problem as it is for solder techniques.

Most pressure techniques involve compressing the package itself to the board. A compressible pad with embedded electrically conductive material, known as a Z-axis connector, is frequently placed between the package and the board. Usually only leadless packages with contact pads on the bottom surface may be used; pressure on the top of a package would stress the point at which splayed leads, such as gull wings, attach to the package. In any event, applying pressure to the top of any package sufficient to maintain a proper electrical connection between the leads and the board contact pads, may damage the package.

OBJECTS AND SUMMARY OF THE INVENTION

Accordingly, it is an object of the present invention to provide a less complex method and apparatus for cooling a plurality of electrical components mounted to a printed circuit board.

Broadly, the invention comprises a base plate mounted on a circuit board proximate to and in registered relation to a number of component sites formed on the circuit board and defined, for each connection site, by a number of connection pads at which an electrical component is to installed. A chuck assembly, configured to receive and carry the electronic components, is affixed to the base plate in a manner that aligns and registers each of the electrical components to the chuck assembly to the base plate, and thereby to the component sites. The manner of alignment locates electrical leads (connections) of each of the electrical components in electrical contact relation with corresponding ones of pads of corresponding component sites.

Where the electrical components are not sealed within the chuck assemblies, a fan blowing air across the circuit board may suffice. A more advanced approach is where, again, the electrical components are not sealed within the chuck assemblies, but the circuit board, or a portion thereof, is sealed within a chamber formed by the circuit board, the base plate, and the alignment plate. In this implementation, the base plate is configured to form a side wall that, with the circuit board and the alignment plate, forms a cooling chamber that enclosed the plurality of electrical components. Ingress and egress, for example through aperatures formed in the base plate, is provided to circulate either the cooled or warmed gas or fluid actively circulated through the chamber, around and across the chuck assemblies and over the circuit board.

Another method of controlling the temperature of components on the circuit board involves an alignment plate with cavities therein. Coolant would be circulated through the cavities. In addition, heat sink devices could extend from the cavities into the chucks as described above. This configuration would also permit cooling components cryogenically. That is, for components which incorporate superconducting material, supercooled gas or fluid may be circulated through the cavities to keep the components below their transition temperatures.

The above, and other objects, features and advantages of the present invention will become apparent from the following description read in conjunction with the accompanying drawings, in which like reference numerals designate the same elements.

DESCRIPTION OF THE PREFERRED EMBODIMENT

The present invention may be used to mount a variety of electrical or electronic components to circuit boards (or comparable method), but has particular application to mounting surface mount technology (SMT) devices of the type having gull wing or "J" connector leads, such as illustrated in the figures. (Unless otherwise noted, the term "lead" is used herein to refer to the portion of an electrical or electronic component through which an electrical connection is made between the component and a circuit board or other component. It will be obvious to those skilled in this art the examples of lead configurations include, in addition to the to the gull wing or J leads illustrated in the Figures, dual inline pins, pin grid arrays, and pad grid arrays.) As indicated above, certain prior art mounting methods for circuit components rely upon pressure applied directly to the device itself (or, more accurately the carrier which houses the chip or electronic component of the device). This can tend to impose stresses sufficient to fracture the device, leading to device failure. The present invention operates to capture and hold only the leads of the device.

Figure 1:
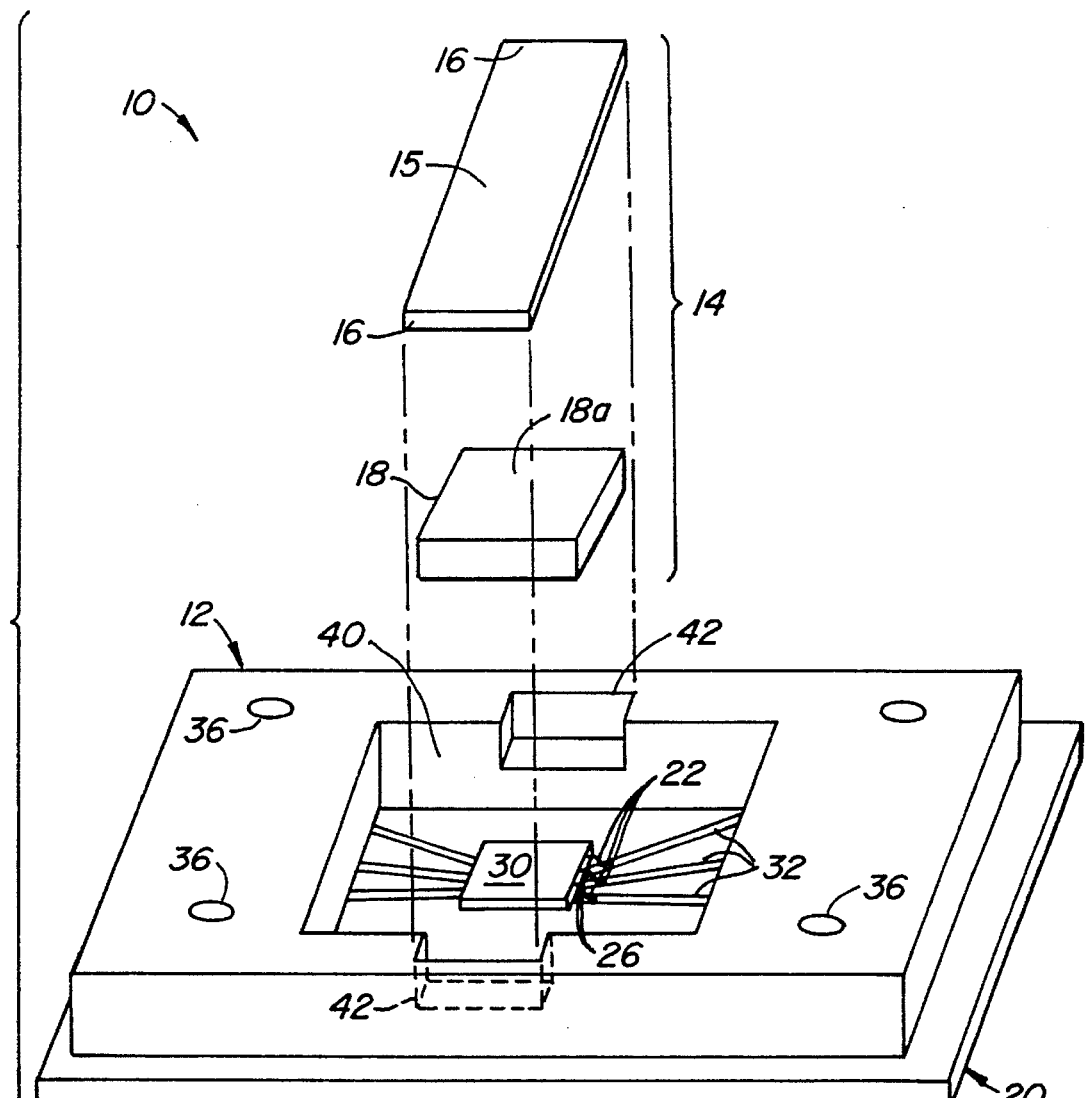
FIG. 1 is an exploded perspective view of an alignment device constructed according to the present invention.
Figure 2:
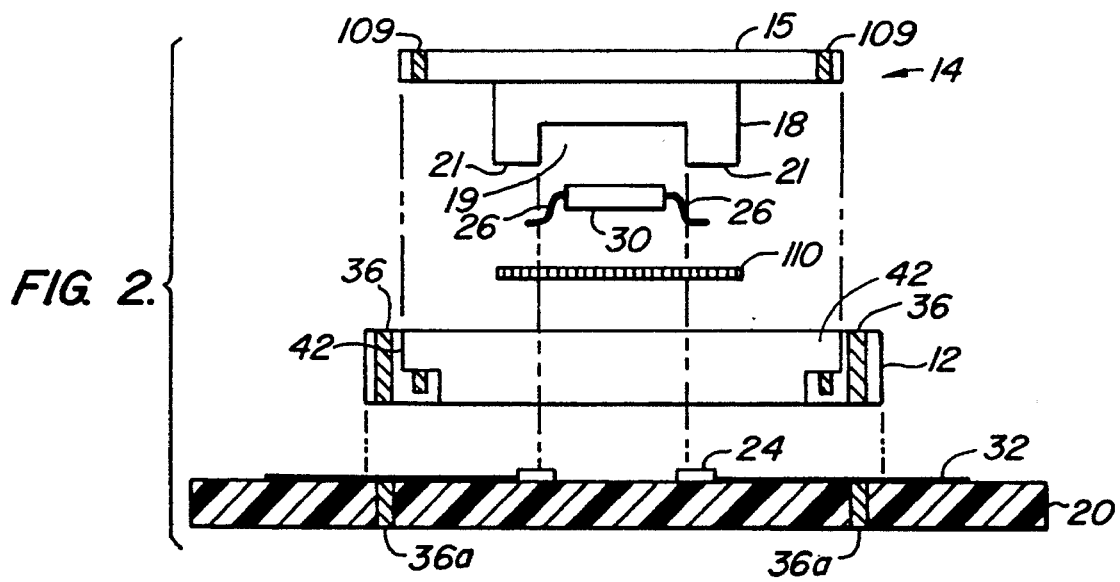
FIG. 2 is an exploded cross-sectional view of the relative position of assembly components in the production process.
Figure 3:
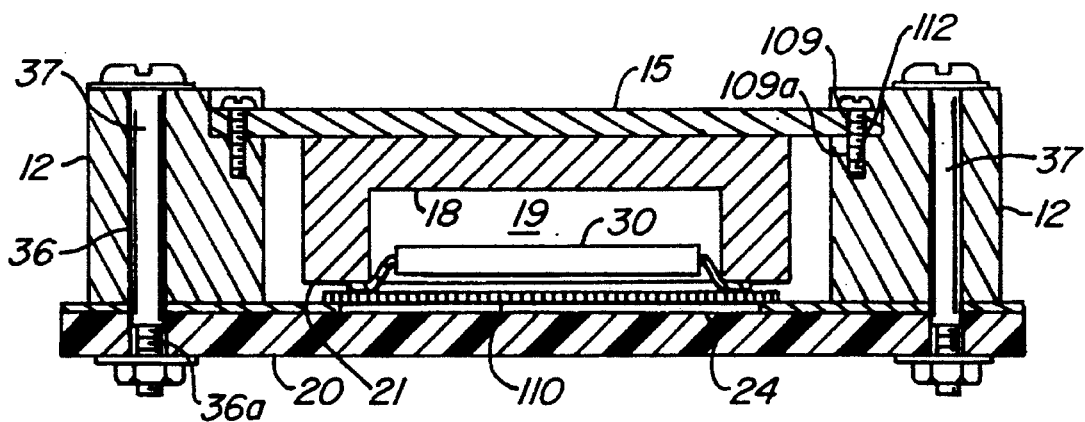
FIG. 3 is a cross-sectional view of assembled device of FIG. 1.

Turning now to FIGS. 1–3, one embodiment of the mounting method of the present invention, designated generally by the reference numeral 10 is illustrated. As FIG. 1 shows, the mounting apparatus 10, comprising a base plate 12 and chuck assembly 14 (shown here in exploded fashion), is installed on a surface of a circuit board 20, proximate a SMT connection site 22. The SMT connection site 22 of the circuit board 20 is conventional in the sense that it is defined by a number of conductive pads 24 that are oriented to receive and connect to corresponding ones of printed leads 26 of an engineering sample SMT device 30 placed thereat. The pads 24, in turn, connect to circuit traces 32 formed on the circuit board 20 for communicating signals to other devices or components (not shown) that may be also mounted on the circuit board 20.

The base plate 12 is formed with alignment holes 36 that align with underlying apertures 36a (FIG. 2) formed in the circuit board 20 to register the base plate 12 to the SMT connection site 22. A central opening 40 is formed in the base plate 12 so that, when mounted to the circuit board 20, access to the SMT connection site 22 is provided therethrough. The central opening 40 of the base plate 12 has alignment slots 42 formed in opposing wall portions thereof for receiving the terminal ends 16 of an alignment plate 15 that forms a part of the chuck assembly 14. The dimensions of the alignment slots 42, together with those of the alignment plate 15 (or, at least the terminal ends 16 of the alignment plate 15), are such that minimal, if any, movement (lateral or longitudinal) is permitted the alignment plate 15 while so installed on the base plate 42.

The chuck assembly 14 includes, in addition to the alignment plate 15, a chuck 18, having a recess 19 formed in an undersurface thereof. The configuration and dimensions of the recess 19 are such that it can snugly receive and hold the sample device 30. As shown, the sample device 30 has J or gull wing leads; however, as indicated above, the present invention may be used with any type of SMT device lead. Here, the recess 19 formed in the chuck 18 is sized to capture the SMT device by the leads; and the bottom peripheral surface 21 of the chuck 18 captures the lateral-extending terminal portions of the SMT device leads between the peripheral surface 21 and the pads 24 of the circuit board 20. It will be evident, however, that if the sample SMT device 30 uses other types of connective leads (e.g., those that linearly extend laterally away from the carrier itself, or those that use a pin array protrusion-type leads formed on the underside of the sample SMT device 30), the recess 19 would be configured to snugly receive the periphery of the chip carrier that forms up the sample SMT device 30.

The chuck 18 is affixed to the alignment plate 15, forming the chuck assembly 14. An alignment process locates the chuck 18 on the alignment plate 15 so that, when the completed chuck assembly 14 is mounted to the base plate 12 with the alignment slots 42 receiving the terminal ends 16 of the alignment plate 15, the recess 19 (and the sample AMT device 30 it holds) will be substantially registered to the SMT connection site 22. This registration also places the leads 26 of the SMT device 30 in substantial alignment with the pads 24, to be held thereagainst in place by the bottom peripheral surface 21 of the chuck 18 for electrical mating. The alignment process establishes the location and position of the chuck 18 relative to the to the base plate 12 through the alignment plate 15. The base plate 12, in turn, is registered to the SMT connection site 22 of the circuit board 20 by alignment of the alignment holes 36 formed in the base plate 12 with the alignment holes 36a formed in the circuit board 20. Thereby, any SMT device carried by the chuck assembly 14 is registered to the SMT connection site 22 for electrical connective engagement of the SMT device leads with corresponding pads 24 when the chuck assembly 14 is mounted to the base plate 12.

The alignment process used to register the chuck 18 to the base plate 12, and thereby to the SMT connection site 22, is as follows. Referring to FIGS. 2 and 3, a sample SMT device 30 is first conventionally mounted to the circuit board 20 (e.g., by wave-soldering, adhesive, or any other technique customarily used to affix SMT devices to circuit boards) with the leads of the sample SMT device 30 in contact with the corresponding pads 24 that form and define the SMT connection site 22. The base plate 12 is attached to the circuit board in proximate relation to the SMT connection site 22 by alignment of attachment holes 36 with corresponding attachment holes 36a formed in the circuit board 20 (and a 37 or other attachment mechanism inserted therethrough). Alternatively, the base plate 12 may be adhesively attached to the circuit board 20, using other techniques to maintain registration. It will soon be evident that in this alignment process, no particular relative relation between the base plate 12 and the SMT connection site 22 is initially necessary other than that site 22 be accessible to the chuck assembly 14 through the central opening 40 of the base plate 12. Also, the base plate 12 should be mounted to the circuit board 20 to that a center line extending between the two alignment slots 42 pass over (or at least proximate) the SMT connection site 22 for reasons that will understood below. However, once registration is established between the chuck 18 and the SMT connection site 22 (through the alignment plate 15, base plate 12 and aligned holes 36, 36a) the relative location and position of the base plate 12 with the SMT connection site 22 must be maintained.

The chuck 15 is then inserted through the central opening of the base plate 40, fitted over the sample device 30 so that the device seats in the recess 19. An adhesive is spread over the top surface 18a of the chuck 18, and the alignment plate 15 is placed in alignment slots 42 of the base plate 12. The dimensions of the alignment plate 15, the chuck 18, and the alignment slots 42 are such that the underside of the alignment plate 15 contacts the top surface 18a of the chuck 18, allowing the adhesive to bind the two together, forming the chuck assembly 14. Further, it can now be seen why the placement of the base plate 12 should be such that a center line extending between the alignment slots pass at least near the SMT connection site 22.

At this point, the alignment process is complete. The chuck 18, now forming a part of the chuck assembly 14, is now registered to the SMT connection site 22.

The present invention may now be used in a manufacturing environment. Here, production versions of the circuit board 20 are provided, identical to that used to align and register the chuck 15 to the SMT connection site 22, including of course the SMT connection site 22 and alignment apertures 36a formed therein to align with the apertures 36 formed in the base plate 12. Further, these alignment apertures 36a formed in production versions of the circuit board 20 should positioned relative to the SMT connection site substantially identical to those formed on the circuit board 20 used in the alignment process, so that when a base plate 12 is installed thereon, and its apertures 36 aligned with those (36a) of the production version of circuit board 20, the base plate 12 will be registered to the SMT connection site 22 of the production circuit board 20 substantially identical to the registration of the base plate 12 to the SMT connection site 22 of circuit board 20 used in the alignment process.

Thus, as illustrated in FIG. 2 and 3, mounting the SMT device 30 on a production version of the circuit board 20 (with an empty SMT connection site 22) merely requires the base plate 12 to be attached by bolts 17 inserted through the attachment holes 36 and aligned attachment holes 36a of the production version of the circuit board 20. So attached, the base plate 12 is registered to the SMT connection site 22 of the production version circuit board 20 in the same manner as it was in the alignment process. An SMT device 30 is fitted to the chuck assembly 14 so that it seats in, and is held by, the recess 19 of the chuck 15. The terminal ends 16 of the alignment plate 15 of the chuck assembly 14 are then inserted into alignment slots 42 and attached to the base plate 12. For this purpose attachment holes 109 (FIGS. 2 and 3) and attachment receiving holes 109a are respectively formed in the chuck assembly and the base plate to receive screws of bolts 112 (FIG. 3) to hold the chuck assembly 14 in place to the base plate 12. As FIGS. 2 and 3 illustrate, the laterally extending terminal portions of the leads 26 emanating from the SMT device 30 are captured and held between the bottom peripheral surface 21 of the chuck 18 and pads 24 of the circuit board 20.

The leads 26 of the SMT device 30 may make direct contact with the pads 24. However, optionally, as shown in FIGS. 2 and 3, a Z-axis connector 110 may be placed between leads 26 and circuit pads 24. Thereby, the SMT device leads 26 are kept in mechanical and electrical connection by the attachment of the chuck assembly 14 to the base plate 12, and the attachment of the base plate 12 to the production version of the circuit board 20. One advantage of using Z-axis connector 110 is that the chuck assembly 14 containing the SMT device 30 may be mounted and demounted repeatedly with minimum wear on circuit pads 24. If the Z-axis connector 110 is omitted, the mechanical and electrical connection may be still maintained, but repeated removal and insertion of the SMT device can act to abrade and score the pads 24 and/or SMT device leads.

Other connection options include using electrically conductive solder or adhesive instead of pressure. The chuck assembly 14 and the base plate 12 would be employed as previously indicated to align and register the SMT device 30 to its proper position relative to the SMT connection site 22 on the circuit board 20. However, the solder or adhesive is spread between the leads 26 and the circuit pads 24 before they are forced into electrical contact. In the preferred embodiment, the circuit board 20 and the SMT device 30 then are tested for electrical and mechanical faults. If the combination fails any of the tests, the chuck assembly 14 containing the SMT device 30 is demated from the base plate 12 and the problem is corrected before the combination is mated again. Once the combination passes the tests, the solder is melted or the adhesive is activated. The chuck assembly 14 and the base plate 12 may then be removed from the production circuit board 20 leaving the SMT device 30 mounted in its proper location.

Figure 4:
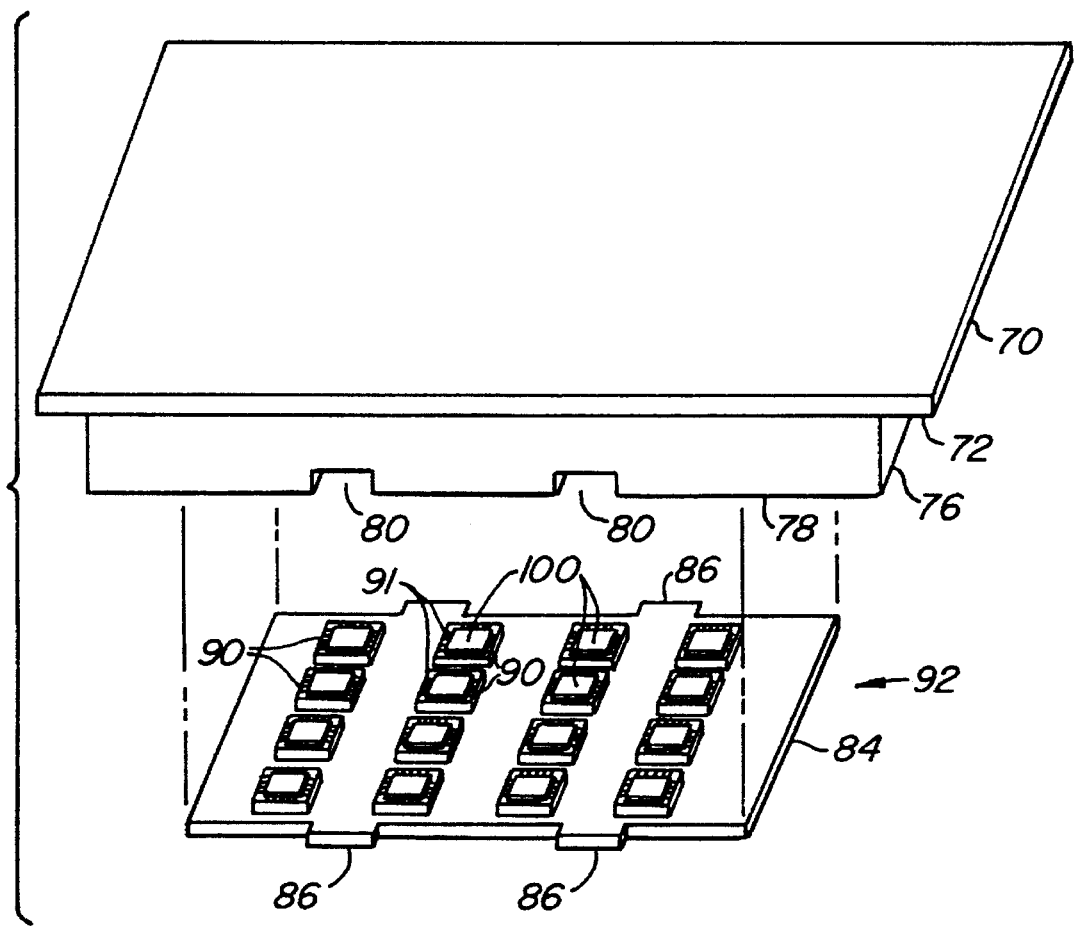
FIG. 4 is an upside-down perspective view of a number of assembled devices, including their relative positions as mounted on an alignment plate, and the relative position of the alignment plate to a base plate and printed circuit board.

The foregoing discussion has taught a method and apparatus for mounting a single SMT device to a circuit board. It should be evident to those skilled in the art that the invention can be extended to mounting multiple SMT devices. Thus, referring now to FIG. 4, a method and apparatus for mounting multiple SMT devices is illustrated. FIG. 4 shows a circuit board 70, having a plurality of SMT connector sites (not shown) formed on a planar surface 72 of the circuit board 70. Affixed to the circuit board 70, such as discussed above, with alignment holes and bolts, or by an adhesive, or any other attachment technique, is a base plate 76 that encircles the SMT connection sites (not shown) on the circuit board 70. The base plate 76 has formed, in opposing wall portions 78 (only one of which can be seen in FIG. 4) alignment elements in the form of notches 80.

A broad, planar alignment plate 84 is formed and configured with alignment tabs 86 to mount to the base plate 76 so that the alignment tabs 86 engage notches 80 to register the alignment plate 84 to the base plate 76.

The alignment phase is essentially the same as that described with respect to mounting a single SMT device. First, a "stand-in" circuit board is used, having SMT devices mounted at the SMT connection sites formed on the circuit board. Chucks 90 are configured with recesses 91 to be fitted over the mounted sample SMT devices, and the alignment plate 84 mounted to the base plate 76 and affixed to the chucks 90, forming a chuck assembly 92. The individual chucks 90 are now registered to the SMT connection sites through the alignment plate 84, base plate 76, and its placement on the circuit board 72.

As above, production models of the circuit board 72, identically structured and configured to that used during the alignment process, including placement of the SMT connection sites (not shown) and the installation of the base plate 70, can now be produced. Similarly, production models of the chuck assembly 92, with the chucks 90 oriented according to the alignment process and affixed to the alignment plate 84 can be constructed. Assembly merely requires installing in each of the chuck assemblies 90 a production versions of the SMT devices 100 by inserting them in the recesses 91 of the chucks 90. The chuck assembly 92 is then installed on the base plate 76 with the tabs 86 received in the notches or grooves 80, thereby registering the SMT devices 100 to the SMT connection sites formed on the surface 72 of the circuit board 70 through (1) orientation and placement of the chucks 90 on the alignment plate 84, (2) registration of the alignment plate 84 to the circuit board 72 through (3) the base plate 76.

Referring specifically to FIG. 3, an embodiment of the invention is shown employing a Z-axis connector 110 on top of which sits SMT device 30. Leads 26 of gull wing configuration extend from the SMT device 30, and are captured between inner edge of the chuck assembly 14 and the Z-access connector 110. The chuck assembly does not touch the SMT device package, but leaves a space 19 between the SMT device 30 package and the chuck assembly 14 inner surface. This volume may now be sealed and made gas tight. That is, a container for the SMT device 30 is formed by the chuck assembly 14, leads 26, and the Z-axis connector 110.

One advantage of sealing the SMT device 30 is that it is then protected from dust and caustic fluids and gases. Thus, the invention may be employed in hostile environments. In addition, it is preferrable to fill the space 19 with a substantially inert gas (e.g. helium, nitrogen, argon) or fluid. It is also preferrable to pressurize the gas to test and insure the seal and to prevent ingassing. Then a wide choice of materials such as silver, copper, and aluminum may be employed for the leads 26 and the circuit pads 24. These materials, especially silver, have excellant electrical properties, but are infrequently employed because of their tendency to corrode. If sealed in a substantially inert volume, the corrosion problem is moot.

Many different types of SMT devices are available. Some of them, such as those containing CPU chips, generate a significant amount of heat which must be dissipated. Depending on the amount of heat generated, different passive and active heat dissipation techniques and devices may be employed.

One solution is to use the leads 26 and the chuck assembly 14 as heat sink devices. Much of the heat the SMT device 30 generates flows to the leads 26. The chuck assembly 14 may draw off this heat if it is constructed of material which is a good thermal conductor while substantially an electrical insulator. A number of such materials are known including ceramic substrate materials incorporating aluminum oxide, aluminum nitride, beryllium oxide, silicon carbide, or boron nitride (BN).

The effectiveness of the above heat dissipating technique and device may be enhanced in different ways. For example, cylinders or slugs of thermally conductive metal, such as copper, may be embedded in the chuck assembly 14. Heat sink devices may be attached to the top of the chuck assembly 14 or may extend into the chuck assembly 14 body. If the volume containing the SMT device 30 is sealed, space 19 may be filled with a relatively good thermally conductive gas, such as hydrogen or helium, or fluid. Alternatively, the chuck assembly 14 may contain openings permitting air to flow around the chuck 18 and/or the SMT device 30 itself.

Another embodiment involves imbedding a screen or other material in the chuck assembly 14 to intercept electromagnetic interference (EMI) either originating from external sources or from the SMT device 30 itself.

Figure 5:
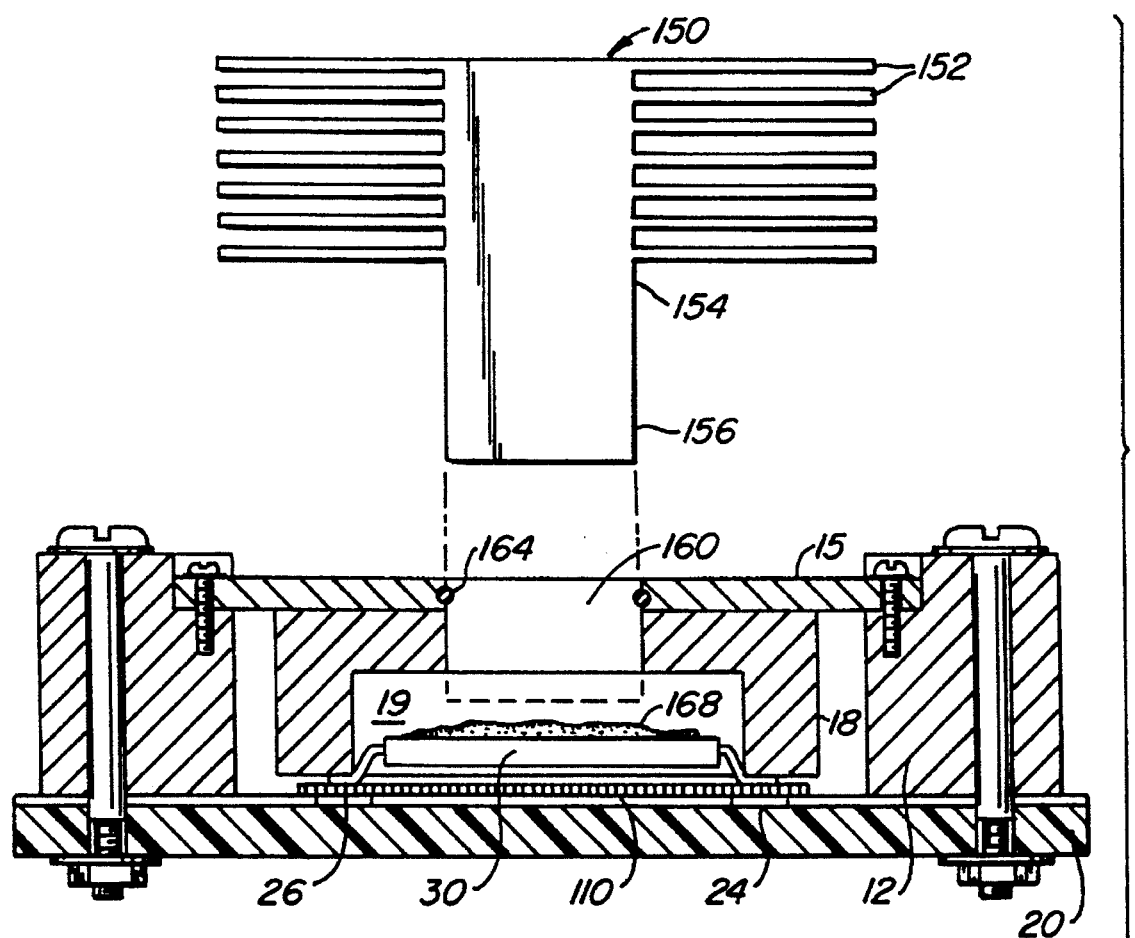
FIG. 5 illustrates the assembled alignment device of FIG. 3, modified to include a heat sync device.

One technique to dissipate heat is to make a central opening in the top of the chuck assembly 14. By itself, this opening may allow sufficient air to circulate to keep the SMT device 30 within its operating temperature range. For additional passive cooling, as illustrated in FIG. 5, thermal grease 168 (a heat conducting adhesive) may be placed on a top surface of the SMT device 30 package. Then a heat sink device 150 may be placed on the thermal grease 168.

In some applications, it may be desirable to combine sealing the SMT device 30 with placing a heat sink device 150 on top of the SMT device 30 package. However, it is important that for gull wing or J leads 26, that the heat sink device does not apply pressure to the package; anything more than a small downward force upon the package will deform the leads 26 and stress the point at which they connect to the package of the SMT device 30.

The solution, as illustrated in FIG. 5, is to make an opening 160 just large enough in the top of the chuck assembly 14 to accomodate a heat sink device. In assembling the production device, thermal grease 168 is first placed on top of the SMT device 30 package. Then the chuck assembly 14 and the SMT device 30 are fitted together. A Z-axis connector 110 is placed upon conductive pads 24; the chuck assembly 14 containing the SMT device 30 is then mounted as described above. The chuck assembly 14 is sealed to the circuit board 20. Next, the heat sink device 150 is placed through the opening 160 in the top of the chuck assembly 14 far enough to adhere to the thermal grease 168 on top of the SMT device 30.

An inert gas or fluid may be introduced into the volume defined by the chuck assembly 14, heat sink device 150, and circuit board 20. Finally, any gap between the opening in the top of the chuck assembly and the heat sink device is closed (with an O ring 164 for example) to complete the seal of the volume containing the SMT device 30.

Figure 6:
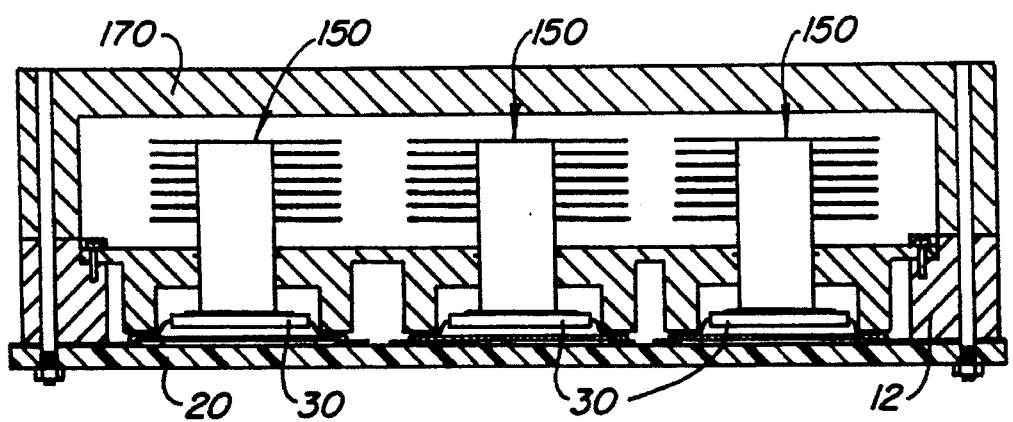
FIG. 6 illustrates multiple components mounted to a circuit board, each having the heat sync device shown in FIG. 5, and all enclosed in a manifold.

Given a sealed device as illustrated in FIG. 6, active cooling systems may be employed. Such a system may be needed for devices which generate prodigious amounts of heat, or, for example, to cryogenically cool SMT devices 30 below threshold temperatures for electrical superconductivity.

The principle is to refrigerate cryogenical cooled gases, such as helium, or fluids, such as liquid nitrogen or liquid helium, and pump them around the heat sink devices 150. If the need for cooling is not as great, a fluid such as water may be employed.

The sealed device serves as a bottom portion of a manifold. A top portion (FIG. 6) completes the manifold; it is a cover 170 surrounding the heat sink devices 150, to provide a sealed conduit for a coolant. It may be attached to the base plate. Finally, openings are provided in the manifold to allow ingress and egress for the coolant as it circulates.

Although the present invention has been described with reference to specific embodiments thereof, numerous modifications can be readily implemented without departing from the spirit and scope of this invention.

Although the present invention has been described with reference to specific embodiments thereof, numerous modifications can be readily implemented without departing from the spirit and scope of this invention.

What is claimed is:

1. Apparatus for cooling a plurality of electrical components mounted on a printed circuit board comprising:

a base plate mounted to the printed circuit board forming a wall member that surrounds the plurality of electrical components, the base plate having alignment elements formed thereon:

an alignment plate mounted to the base plate to engage the alignment elements, registering the alignment plate to the circuit board, the alignment plate having chuck assemblies holding the electrical components in registered relation and in electrical contact with the circuit board, the alignment plate forming with the base plate and circuit board an enclosed space containing the plurality of electrical components, the alignment plate having a number of openings formed therein to provide access to the enclosed space;

a plurality of heat conductive elements each having a first portion mounted in corresponding ones of the number of openings and extending into the enclosed space and a second portion exterior of the enclosed space; and a cover mounted to enclose the second portions of the plurality of heat conductive elements to form a conduit to direct circulation of a coolant between the cover and the alignment plate and about second portions of the plurality of heat conductive elements.

2. The apparatus of claim 1, wherein the second portion of each of the plurality of heat conductive elements includes a plurality of cooling fins.

3. The apparatus of claim 1, wherein the number of openings are formed at locations providing access to predetermined ones of the plurality of electrical components.

4. The apparatus of claim 3, wherein each of the number of openings are formed to generally overlie corresponding ones of the predetermined ones of the plurality of electrical components.

5. The apparatus of claim 4, wherein the first portion of each heat conductive element is in heat conductive communication with corresponding ones of the predetermined ones of the plurality of electrical components.

* * * * *